United States Patent
Russell et al.

(10) Patent No.: US 6,699,402 B2
(45) Date of Patent: Mar. 2, 2004

(54) CHEMICAL MECHANICAL POLISHING COMPOSITIONS FOR CMP REMOVAL OF IRIDIUM THIN FILMS

(75) Inventors: Michael W. Russell, Norwalk, CT (US); Peter C. Van Buskirk, Newtown, CT (US); Jonathan J. Wolk, Bridgewater, CT (US); George E. Emond, Southington, CT (US)

(73) Assignee: Advanced Technology Materials, Inc., Danbury, CT (US)

(*) Notice: Subject to any disclaimer, the term of this patent is extended or adjusted under 35 U.S.C. 154(b) by 0 days.

(21) Appl. No.: 10/034,764

(22) Filed: Dec. 28, 2001

(65) Prior Publication Data

US 2002/0081849 A1 Jun. 27, 2002

Related U.S. Application Data

(63) Continuation of application No. 09/216,679, filed on Dec. 18, 1998, now Pat. No. 6,395,194.

(51) Int. Cl.[7] .............................................. C09K 13/00
(52) U.S. Cl. ..................... 252/79.1; 252/79.2; 438/691; 438/692
(58) Field of Search ..................... 438/690, 691, 438/692, 693; 252/79.1, 79.2; 51/307, 308, 309

(56) References Cited

U.S. PATENT DOCUMENTS

| | | | |
|---|---|---|---|
| 3,775,201 A | 11/1973 | Basi | 438/692 |
| 4,909,863 A | * 3/1990 | Birkmire et al. | 148/33.4 |
| 4,983,650 A | 1/1991 | Sasaki | 524/27 |
| 5,104,421 A | 4/1992 | Takizawa et al. | 51/295 |
| 5,157,876 A | 10/1992 | Medellin | 451/36 |
| 5,340,370 A | 8/1994 | Cadien et al. | 51/308 |
| 5,527,423 A | 6/1996 | Neville et al. | |
| 5,645,736 A | 7/1997 | Allman | 216/89 |
| 5,695,384 A | * 12/1997 | Beratan | 451/28 |
| 5,700,383 A | 12/1997 | Feller et al. | |
| 5,993,686 A | * 11/1999 | Streinz et al. | 252/79.3 |
| 6,068,787 A | * 5/2000 | Grumbine et al. | 252/79.1 |
| 6,083,840 A | * 7/2000 | Mravic et al. | 438/693 |
| 6,395,194 B1 | * 5/2002 | Russell et al. | 252/79.1 |

OTHER PUBLICATIONS

M. Fayolle et al., "W CMP process integration: consumables evaluation—electrical results and end point detection", Microelectronic Engineering, 37/38 (1997) pp. 347–352.
M. Hoshino et al., "Chemical Mechanical Polishing of Metalorganic chemical vapor deposited gold for LSI interconnection", Jpn. J. Appl. Phys. 32 (1993) Pt. 2, No. 3B.

* cited by examiner

Primary Examiner—Nadine G. Norton
Assistant Examiner—Lan Vinh
(74) Attorney, Agent, or Firm—Steven J. Hultquist; William F. Ryann

(57) ABSTRACT

A chemical mechanical polishing (CMP) slurry composition for removing noble metal material from a substrate having the noble metal material deposited thereon, for example, a semiconductor device structure including thereon a layer of the noble metal material, e.g., iridium, patterned for use as an electrode. Such polishing slurry composition contains abrasive polishing particles, a bromide compound, a bromate compound for providing free bromine as an oxidizing agent in the composition, and an organic acid for mediating decomposition of the bromate compound in the composition. The CMP slurry composition of the invention is particularly effective for planarization and/or removal of noble metal(s) from the substrate, in applications such as the fabrication of ferroelectric or high permittivity capacitor devices.

16 Claims, 2 Drawing Sheets

CHEMICAL MECHANICAL POLISHING COMPOSITIONS FOR CMP REMOVAL OF IRIDIUM THIN FILMS

CROSS-REFERENCE TO RELATED APPLICATION

This is a continuation of U.S. patent application Ser. No. 09/216,679 filed Dec. 18, 1998 in the names of Michael W. Russell, Peter C. Van Buskirk, J. Wolk, and George T. Emond for "Chemical Mechanical Polishing Compositions, and Process for the CMP Removal of Iridium Thin Films Same," now allowed.

BACKGROUND OF THE INVENTION

1. Field of the Invention

The present invention relates to a chemical mechanical polishing (CMP) composition for removing noble metals in a CMP process.

2. Description of the Related Art

There is currently a major effort in semiconductor companies, worldwide, to commercialize high dielectric constant and ferroelectric thin films in advanced DRAMs and ferroelectric random access memories (FeRAMs), respectively. These materials include $BaSrTiO_3$ (BST) for DRAMs and $PbZrTiO_3$ (PZT) and $SrBi_2Ti_2O_9$ (SBT) for FeRAMs.

It is well known that these materials require electrodes made from noble metals or noble metal alloys such as Pt, Ir, $IrO_2$, Pt—Ru, etc., and sub-micron patterning of both the noble metals and the ferroelectric films is very difficult because of the absence of volatile products for the elemental constituents. State-of-the-art dry etching processes for Pt and Ir are known to have fundamental difficulties due to the predominantly physical (not chemical) mechanism for material removal, resulting in formation of unwanted structures (sometimes called "ears") at the edges of the electrodes.

Prior copending U.S. patent application Ser. No. 08/975,366 filed Nov. 20, 1997 in the names of Peter C. Van Buskirk and Peter S. Kirlin for "Chemical Mechanical Polishing of FeRAM Capacitors," describes the use of CMP methodology in the fabrication of ferroelectric or high permittivity sub-micron integrated capacitors, to etch noble metal films and perovskite oxide thin film layers, without the use of reactive ion etching (RIE) or similar methods. In the method of this application, a ferroelectric capacitor structure is fabricated by sequentially depositing a bottom electrode layer, a ferroelectric layer and a top electrode layer on a base structure, optionally with deposition of a layer of a conductive barrier material beneath the bottom electrode layer, to form a capacitor precursor structure. This capacitor precursor structure is planarized by chemical mechanical polishing to yield the ferroelectric capacitor structure, e.g., a stack capacitor or trench capacitor. The process is carried out without dry etching of the electrode layers or dry etching of the ferroelectric layer, to yield ferroelectric capacitors having a very small feature size, as for example between 0.10 and 0.20 $\mu$m.

In addition to the absence of the undesirable dry etching methods, other advantages of the CMP approach of this pending patent application include fewer mask levels, fewer process steps, and an inherently planarized capacitor structure that facilitates subsequent metallization.

The art continues to seek new CMP techniques and compositions for carrying out CMP processes.

There is especially a need for providing CMP techniques and compositions that are particularly adapted for removal of noble metal films such as are employed in the fabrication of electrode structures for semiconductor devices.

It therefore is an object of the present invention to provide improved CMP techniques and compositions.

It is another object of the invention to provide improved CMP techniques and compositions suitable for selective removal of noble metals and noble metal alloys, e.g., of gold, platinum, iridium, etc. from semiconductor device structures having such noble metal-based materials deposited on or otherwise present in the device structure.

Other objects and advantages of the present invention will be more fully apparent from the ensuing disclosure and appended claims.

SUMMARY OF THE INVENTION

The present invention relates to a CMP composition suitable for selective removal of noble metals and noble metal alloys from semiconductor device structures having such noble metal-based materials deposited on the device structure.

In one aspect, the invention relates to an aqueous polishing slurry composition, for use in a chemical mechanical polishing process to remove noble metal and/or noble metal alloy from a substrate having said noble metal and/or noble metal alloy deposited on the substrate, comprising:

abrasive polishing particles;
a bromide compound;
a bromate compound; and
an organic acid.

The bromate compound as employed in the CMP polishing slurry composition of the present invention provides free bromine as an oxidizing agent in the composition. It is preferred that the bromate compound exists in the slurry composition in an amount less than the bromide compound.

The organic acid as employed in the CMP polishing slurry composition of the present invention mediates decomposition of the bromate compound in the composition.

In a particular compositional embodiment, the chemical mechanical polishing composition of the invention has the following composition by weight, based on the total weight (100%) of the composition:

| Compound | Amount (wt. %) |
| --- | --- |
| anionic surfactant | 0–4% |
| ammonium bromide | 12–18% |
| potassium bromate | 4–6% |
| oxalic acid | 2–4% |
| DI Water | -balance- |

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
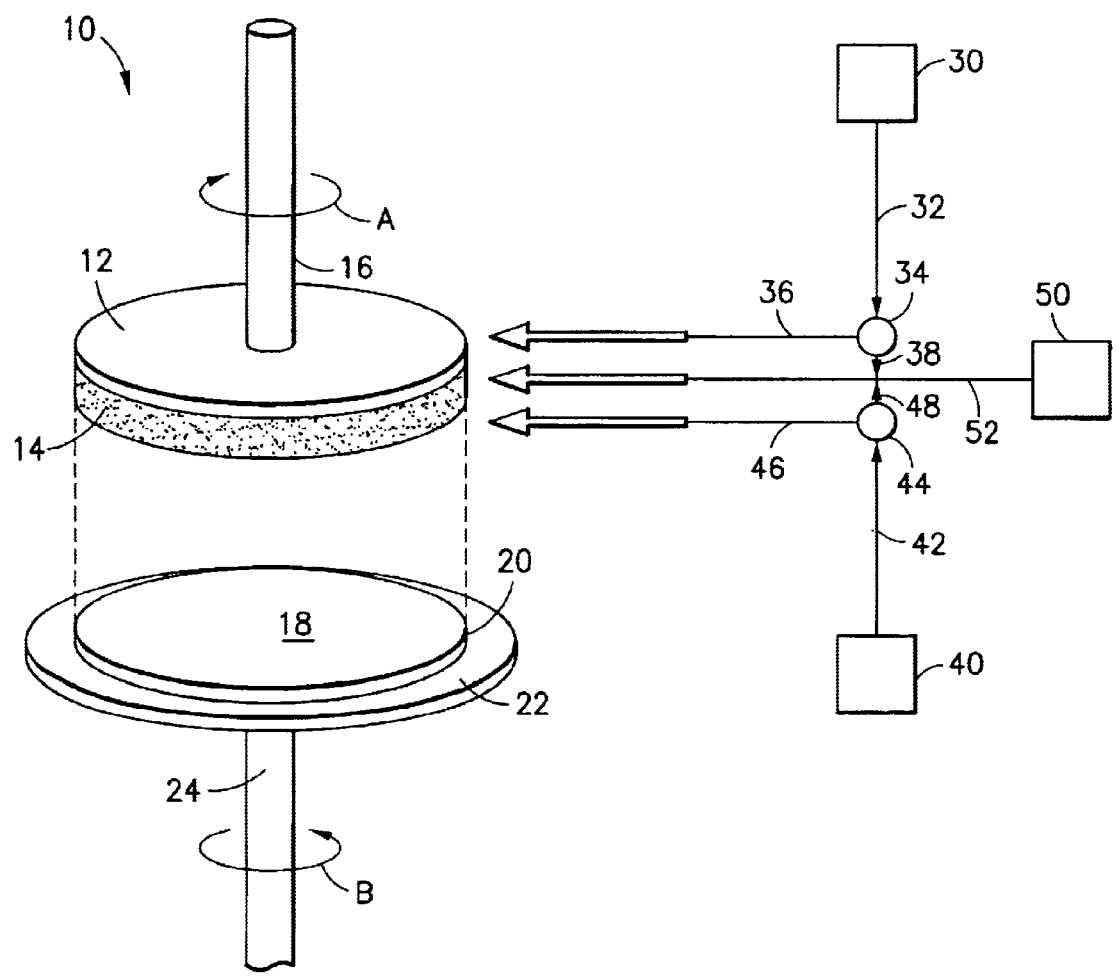
FIG. 1 is a schematic representation of a chemical mechanical polishing system according to one embodiment of the invention.

The disclosures of the following United States Patent Applications are hereby incorporated herein by reference:

U.S. patent application Ser. No. 08/975,366 filed Nov. 20, 1997 in the names of Peter C. Van Buskirk and Peter S. Kirlin for "Chemical Mechanical Polishing of FeRAM Capacitors."

The present invention contemplates an aqueous polishing medium (slurry) containing solid polishing particles and a halide-based oxidizing agent. Such composition may be used in a chemical mechanical polishing process to remove noble metal, such as gold, platinum, iridium, etc., and noble metal alloys, such as platinum-iridium, gold-iridium, platinum-gold-iridium, etc., from a substrate having such noble metal or noble metal alloy deposited on the substrate.

The substrate may be of any suitable type, such as a semiconductor device structure having the noble metal material present thereon in a layer defining an electrode structure. The composition and method of the invention have particular utility in application to the removal of iridium from semiconductor device structures, a significant advance in the art in view of the ubiquity of iridium in electrode structures of microelectronic devices such as ferroelectric or high permittivity capacitors, but it will be recognized that the utility of the invention is not thus limited, but broadly extends to and includes chemical mechanical polishing removal of noble metal material from any type of substrate to which chemical mechanical polishing may be usefully applied for such removal.

As used herein, the term "noble metal material" refers to material containing a noble metal such as gold, platinum, palladium, iridium, ruthenium, or a mixture, blend, alloy or other combination of a noble metal with other metals or materials, such as other noble metal(s).

As used herein, the term "slurry" is intended to be broadly interpreted to include solutions, suspensions, dispersions and semisolids, as forms of the CMP composition of the present invention, containing abrasive particles and a component chemically reactive with the noble metal material.

In one preferred embodiment, a CMP composition in accordance with the invention may be reacted under mechanical force with the surface of a semiconductor substrate having an exposed layer of noble metal, e.g., iridium, thereon. The reaction forms a reaction product layer that is adhered to the semiconductor substrate with less adhesive strength than the original iridium metal, and that may be removed from the substrate by mechanical abrasion in the chemical mechanical polishing action, to effect complete removal of the noble metal material layer from the substrate.

Noble metals such as iridium possess very low chemical reactivity. The removal of noble metal material from a semiconductor substrate using a CMP process in accordance with the present invention is based on the reaction of the noble metal material with a suitable chemistry to produce as the reaction product chemical species that are readily removable from the substrate.

In one preferred embodiment of using a CMP composition in accordance with the invention to remove iridium from a semiconductor substrate, chemical mechanical polishing parameters for the removal of iridium may include the CMP process conditions set out in Table 1 below.

TABLE 1

Preferred chemical mechanical polishing parameters for the removal of iridium

| Parameter | Value | Preferred Value |
| --- | --- | --- |
| Head Pressure | 1–10 psi | 7 psi |
| Head Rotation | 30–100 rpm | 85 rpm |
| Platen Rotation | 30–100 rpm | 55 rpm |
| Oxidizer Flow | 10–100 ml/min. | 100 ml/min. |
| Abrasive Flow | 10–100 ml/min. | 25 ml/min. |
| Abrasive | 1–10 wt. % alumina | 6 wt. % alumina (AP-4) |
| Polishing pad | Freudenberg | Fruedenberg |
| Oxidizer | see Table 2 | see Table 2 |

The head pressure is the pressure exerted on the substrate by the polishing pad. This pressure must be applied by the polishing pad to the substrate at an appropriate level, since too high a pressure will cause fracture of most semiconductor substrates. Under normal operating conditions, the head (holding the sample) and platen (the opposing surface onto which a polishing pad is mounted) rotate opposedly (counter-rotationally) with respect to one another. The head pressure can be readily empirically determined for a specific CMP application, using the Preston equation, according to which the removal rate for a surface is directly proportional to both the head pressure and velocity of the polishing pad, and the polish rate is zero in the absence of either pressure or velocity.

A chemical mechanical polishing process using the CMP slurry composition of the invention provides an enhanced material removal rate from high points on surfaces (as compared to recessed areas), thereby planarizing the substrate. The chemical reaction effects of such chemical mechanical polishing process alone will not achieve planarization because the chemical actions involved in such process are isotropic. Mechanical grinding alone may theoretically achieve a desired planarization but planarization solely by mechanical action is not desirable because of extensive associated damage to the material surface. Accordingly, a combination of mechanical grinding and chemical action is employed and effective to achieve a desired planarization.

The CMP compositions of the invention comprise an abrasive component in combination with a chemical constituent that is reactive with the noble metal material to oxidize same for mechanical removal.

The abrasive used in the CMP compositions of the invention may be of any suitable type. One preferred abrasive material usefully employed in the practice of the invention comprises a 6 wt. % aqueous dispersion of alumina (mean particle size<0.1 microns), commercially available under the tradename "AP-4" from Intersurface Dynamics, Inc. (Bethel, Conn.). Other illustrative abrasive materials include, but are not limited to, silica or quartz ($SiO_2$), ceria ($CeO_2$), diamond, silicon carbide (SiC), etc. The abrasive material may be of a single type or may comprise mixtures of different abrasive components. Further, the abrasive material of such same or different types, may have a uniform particle size and shape, or the abrasive material may be heterogeneous in such particle size and/or shape characteristics. The concentration of particles in the abrasive slurry may be widely varied in the broad practice of the present invention, depending on the specific application involved. By way of example, for the chemical mechanical polishing of semiconductor device structures that contain sub-micron features, the mean particle size of the abrasive particles will typically be preferably below about 1 micron, and most preferably below about 0.1 micron.

The reactive component (oxidizer chemistry) of the CMP composition likewise may be of any suitable type that is reactive with the noble metal material so that such material is more efficiently removed under the CMP process conditions employed.

In one embodiment of the invention, the oxidizer component is comprised of an aqueous solution of halide salts and acids, with a pH in the range of from about 2 to about 4. Such chemistry may additionally include the presence of suitable surfactant(s) and/or stabilizing agent(s), as well as any other additives or components that are efficacious or otherwise appropriate to the use of the CMP composition containing same.

Table 2 below sets out the composition of an oxidizer chemistry according to one specific embodiment of the present invention. In Table 2, the constituents of the CMP composition are listed in the preferred order that they are combined in order to form the reactive component in the CMP composition.

TABLE 2

Preferred oxidizer chemistry for Ir CMP

| Compound | Symbol | Amount (wt. %) | Preferred Amount (wt. %) |
|---|---|---|---|
| DI Water | $H_2O$ | -balance- | -balance- |
| Synkad 260 (anionic surfactant) | — | 0–4% | 3 |
| ammonium bromide | $NH_4Br$ | 12–18% | 18 |
| potassium bromate | $KBrO_3$ | 4–6% | 6 |
| oxalic acid | $H_2C_2O_4$ | 2–4% | 4 |

It will be understood that suitable alternatives may be substitutionally employed for the various constituents of the oxidizer chemistry in the foregoing specific composition. In such illustrative composition, deionized water is the principal solvent for the oxidizer solution. The anionic surfactant (e.g. carboxylic acid) is next added to the mixture to suppress $Br_2$ outgassing and to promote the formation of micro-bubbles (rather than macro-bubbles). As such, the anionic surfactant functions as a stabilizing agent in the oxidizer chemistry. A large number of commercial surfactants are available and useful for such purpose.

Ammonium bromide ($NH_4Br$) is next added to (i) maintain the concentration of active bromine in solution by reducing the amount of (undesirable) outgassing of $Br_2$ according to the reaction $NH_4Br+Br_2\rightarrow NH_4Br_3$, and (ii) provide ammonium ion ($NH_4$) reactive with the oxalic acid to form an oxalic acid/ammonium oxalate complex that increases the uniformity of the reaction. The bromide salts of potassium, sodium, and hydrogen are alternatives to ammonium bromide for such purpose. Other bromide compounds likewise may be usefully employed for such purpose.

Potassium bromate next is added to constitute a principal source of free bromine in the mixture. Various other bromates may be employed, and specific alternatives to potassium bromate for such purpose include ammonium bromate, sodium bromate, and hydrogen bromate.

Oxalic acid then is added and functions as an acid initiator. The acid works to promote decomposition of the bromate and thus provide the solution with its source of reactive bromine. Any of various other organic acids may substitute as the acid initiator. Examples include formic acid, malonic acid, malic acid, gluconic acid, lactic acid, etc.

The oxidizer chemistry given in Table 2 is a preferred embodiment of the CMP composition of the invention, due largely to the high concentration of reactive species therein, which provides an aggressive oxidation rate and therefore a high CMP noble metal material removal rate. It will be appreciated that a high removal rate of the target noble metal material is in many circumstances desirable; however, intentional dilution of the oxidizer chemistry, by reducing the concentration of one or more active species or by increasing the amount of water, may, in addition to lowering the removal rate of the target material, also affect the removal rate of other layers within the structure being polished and therefore promote a desired selectivity between the target material and neighboring materials.

Additional oxidizer chemistry systems within the broad practice of the invention that are effective for the CMP of noble metal materials include, without limitation, those described below.

One such CMP composition comprises as the oxidizer component thereof a mixture of sodium hypochlorite (NaOCl) and a bromide compound, as for example ammonium bromide ($NH_4Br$), or the other bromide compounds illustratively described hereinabove. These compounds react to form a bromine-chlorine (Br—Cl) complex, of which many are known to exist. Such Br—Cl complexes are highly reactive to iridium and other noble metals. Because NaOCl and $NH_4Br$ combine violently—a large volume of gas is released as they are mixed—a solution of $NH_4Br$ should be added slowly to a chilled solution of NaOCl to minimize the adverse effects of mixing, in the formulation of such CMP composition.

Another illustrative CMP composition includes an the oxidizer component thereof a mixture of an organic acid, e.g., formic acid, or other organic acid species described hereinabove, and stannous fluoroborate. Active fluoride ions from the fluoroborate compound are yielded by the formic acid. Both tin and boron control the rate of reaction and stabilize the system. Other fluoride source compounds, or other halogen-containing compounds, may likewise be employed for such purpose.

In another embodiment the present invention relates to a method for slurry dispensing, by which the slurry composition is delivered to the CMP polishing pad for the chemical mechanical polishing operation.

According to one embodiment of such method, separately prepared abrasive and oxidizer solutions are stored separately and mixed in situ on the polishing pad. This method allows independent control of both the abrasive:oxidizer ratio as well as the total flow of slurry. Such control will enable the user to control the removal rate and selectivity of the layers being polished. For example, one set of slurry flow parameters may be chosen for removal of the bulk of the target layer thickness, while a second set of parameters are desired to terminate the polishing process as an underlying layer is exposed.

According to a second embodiment of the chemical mechanical polishing method of the invention, the reactive components of the oxidizer chemistry are stored separately and combined in situ on the polishing pad. For the illustrative oxidizers disclosed above, the useful life of the mixtures is a few hours to at most a few days. This is attributable to the fact that when the acid initiator is combined with the remaining components of the oxidizer solution, the evolution of halide gases ($Br_2$, $Cl_2$, and $F_2$) contributes to the weakening of the solution's oxidation potential. It therefore is preferred to keep separate: a) the acid initiator solution, and b) the halide/surfactant solution, until such time as polishing is begun. According to this second embodiment, multiple solutions (abrasive, acid initiator, and halide/surfactant solution) are dispensed simultaneously onto the polishing pad during the polishing process.

It may be desirable during chemical mechanical polishing to dispense the respective constituent solutions (abrasive, acid initiator, and halide/surfactant solution) of the CMP composition via a graded flow system. That is, the flow rates of each constituent solution are independently controlled throughout the polishing process. Polish rate, selectivity, and uniformity may be controlled more precisely by this approach, by selectively varying the relative proportions of the respective constituent solutions that are combined to form the CMP composition.

To deliver one or more parts of the CMP composition to the polishing platen with a high degree of temporal control, a pulsed system incorporating a spray may be employed. A pumping system comprising one or more pumps, such as a peristaltic pump, mechanical pump or other motive transport device(s) for the delivery of liquids and slurries, may be used. Alternatively, a pressurized gas such as argon or nitrogen may be utilized to transport the solution. The CMP composition may be delivered onto the surface of the polishing pad by direct liquid issuance onto the surface of the pad from proximately positioned liquid supply conduit (s) joined to suitable source(s) of the constituents of the CMP solution, so that the liquid constituents distribute over the pad surface by permeation or capillary action, for mixing on the pad surface. Alternatively, liquid supply conduit(s) joined to suitable source(s) of the constituents of the CMP solution can be coupled to interior manifold or distribution channels in the platen, for mixing of the constituents in the platen interior passages and flow into the pad mounted on the platen. As a still further alternative, liquid supply conduit (s) joined to suitable source(s) of the constituents of the CMP solution may be coupled to nozzles, jets, or disperser heads to spray the liquid constituents onto the pad surface for mixing thereon.

Any of the foregoing alternative arrangements can be further modified to provide for mixing of two or more respective constituents of the CMP composition prior to introduction of same to the pad. For example, the various constituents may be mixed in a mixing chamber joined to the liquid supply conduit(s) to yield the mixed CMP composition for subsequent introduction to the polishing pad in an above-described manner.

FIG. 1 is a schematic representation of a chemical mechanical polishing system 10 according to one embodiment of the invention.

In the FIG. 1 system 10, the platen 12 is mounted on the vertically aligned shaft 16 which is joined to suitable drive means (not shown) such as an electric drive motor, turbine, pneumatic rotary drive, or other motive rotational means for causing the shaft to rotate in the direction indicated in FIG. 1 by arrow A.

Joined to the lower face of the platen 12 is a polishing pad 14. The polishing pad may be secured to the platen 12 in any suitable manner.

Arranged in axial register with the platen 12 is a head 22 to which the substrate wafer 20 is secured in a conventional manner to present a main top face 18 to the polishing pad 14. The head 22 is mounted on a shaft 24 coupled to power driving means (not shown), arranged to drive the shaft rotationally in the direction indicated in FIG. 1 by arrow B. The drive means associated with shaft 24 may be of the same type as employed to drive shaft 16 and the platen 16 mounted thereon, and such means may be coupled, e.g., by suitable gearing, transmission, or counter-axle arrangement, to concurrently drive the respective shafts in opposite directions to one another as shown.

By such arrangement, the platen (and polishing pad mounted thereon) and the head (and wafer substrate mounted thereon) are rotated counter-rotationally with respect to one another, and the pad 14 is brought into contact with the substrate main top surface 18 under suitable bearing pressure exerted by the polishing pad on the surface 18 of the wafer.

The chemical mechanical polishing composition is schematically shown in FIG. 1 as being delivered to the polishing pad. For example, the CMP composition may comprise an abrasive dispersion in a suitable solvent or suspension medium, which is stored in a supply vessel 30, for discharge therefrom in line 32. Line 32 is joined to three-way valve 34, as is line 38, and line 36. A supply vessel 50 is also provided for a constituent of the oxidizer chemistry, and such chemistry, in the form of a solution or suspension, is flowed in line 52 to the polishing pad. The oxidizer chemistry may be solely contained in supply vessel 50, or alternatively supply vessel 50 may hold only a first constituent of the oxidizer chemistry, with supply vessel 40 holding a second constituent of the oxidizer chemistry. The supply vessel 40 is joined to a line 42, which in turn is joined to three-way valve 44. Also joined to valve 44 are line 48 and line 46.

The CMP composition supply arrangement schematically shown in FIG. 1 may be operated in various modes.

For example, the completely mixed CMP composition may be formed by flowing abrasive constituent in line 32 through valve 34 to line 36 for delivery to the polishing pad 14, while the first oxidizer constituent is flowed from supply vessel 50 in line 52 to the polishing pad, and the second oxidizer constituent is flowed from supply vessel 40 through valve 44 to line 46 for delivery to the polishing pad. In this manner, three separate constituent streams of the CMP composition are individually flowed to the polishing pad.

Alternatively, the three constituents may be mixed prior to their delivery to the polishing pad. In such arrangement, the abrasive constituent is flowed in line 32 through valve 34 to line 38, from which the abrasive constituent is flowed into line 52 for mixing with the first oxidizer constituent therein. Concurrently, the second oxidizer constituent is flowed in line 42 from supply vessel 40 through the valve 44 to line 48, from which the second oxidizer constituent is flowed into line 52 for mixing with the first oxidizer constituent and the abrasive constituent therein. The resultingly mixed and consolidated stream constitutes the CMP composition and is flowed from line 52 to the polishing pad.

As a further alternative, the abrasive constituent may be flowed in line 32 from supply vessel 30 through valve 34 to line 36 for delivery to the polishing pad, while the first and second oxidizer constituents are mixed, by flow of the first oxidizer constituent in line 52 with flow of the second oxidizer constituent in line 42 from supply vessel 40 through valve 44 and line 48 to line 52, for mixing of the first and second oxidizer constituents in line 52, so that the oxidizer constituent is fully mixed when delivered from line 52 to the polishing pad.

As yet another alternative, when the CMP composition may be mixed and remain viable for CMP usage for an extended period of time, such storage-stable CMP composition may be mixed and supplied to the polishing pad 14 from any one of the supply vessels 30, 40 or 50. The system thereby is seen to be very versatile in respect of accommodating a wide variety of CMP composition make-up and delivery modalities.

It will therefore be apparent from the foregoing that the respective constituents of the CMP composition can be mixed in any suitable combination on the pad 14 or upstream thereof, by appropriate manipulation of the flow control valves 34 and 44, as may be necessary or desirable in a given end use application of the invention. Further, such flow control valves 34 and 44 can be selectively adjusted to control the relative proportions of the respective constituents of the CMP composition that are combined to form the CMP composition for use on the surface of the pad 14 to effect removal of the noble metal material from the wafer substrate surface 18.

The FIG. 1 system 10 may therefore be utilized to deliver to the polishing pad a suitable CMP composition in accordance with the invention, to effect CMP processing of a substrate and planarization thereof, with removal of the noble metal material from the surface of the substrate.

Figure 2:
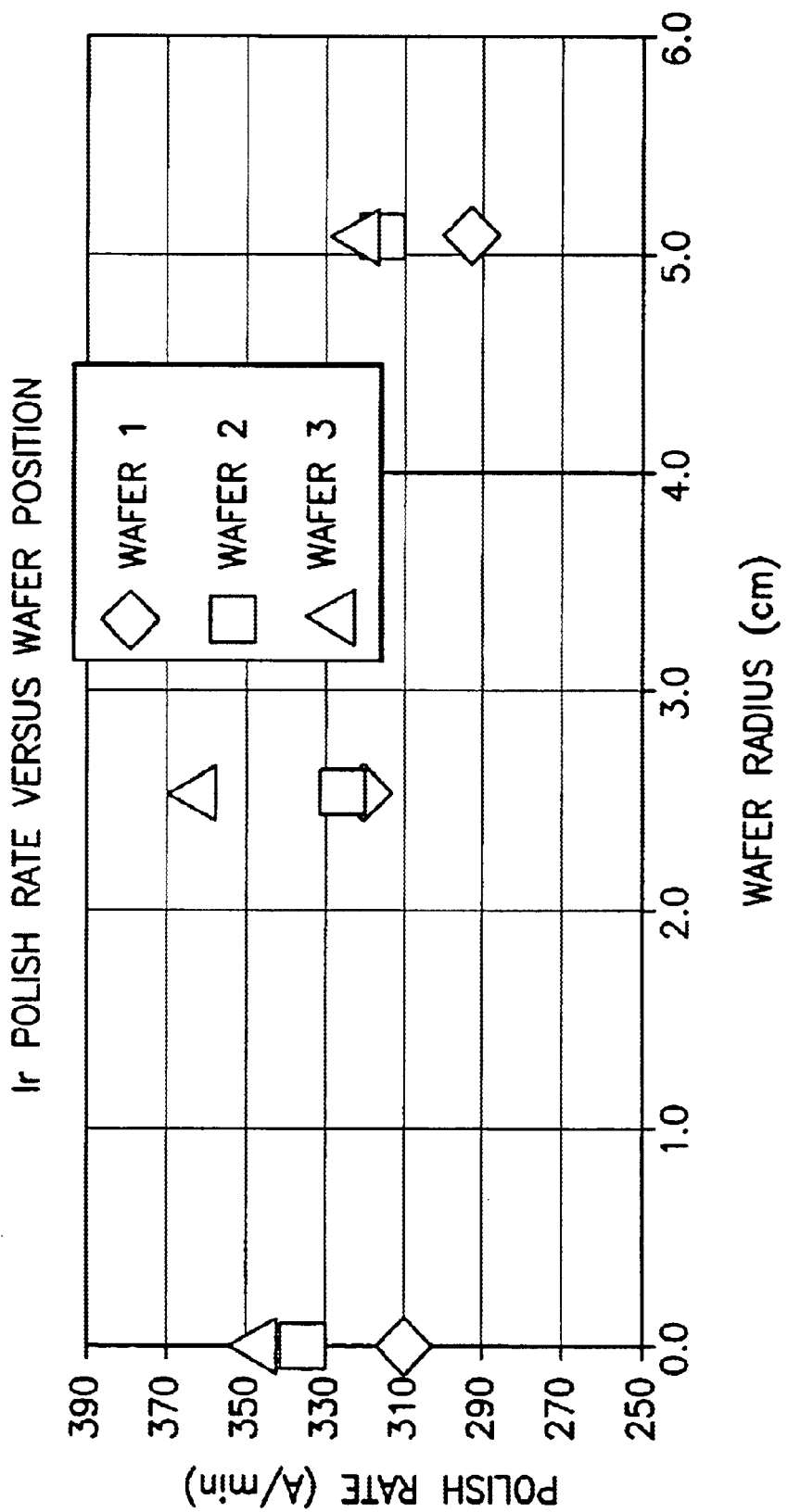
FIG. 2 is a graph of iridium removal rate (polish rate, in Angstroms per minute) as a function of position on the wafer, for three wafers polished in succession, in accordance with the invention.

FIG. 2 is a graph of iridium removal rate (polish rate, in Angstroms per minute) as a function of position on the wafer, for three wafers polished in succession, in which each of the wafers is polished for two minutes according to the preferred polishing parameters in Tables 1 and 2.

Due to a polishing pad "break-in" phenomenon, the polish rate from the first to the third wafer increased from an average of 308 Angstroms per minute (A/min) to 346 A/min. The break-in phenomenon is attributed to a finite time necessary to impregnate the polishing pad with the polish media, thus increasing the polishing efficiency of the pad as it becomes more saturated with the polish medium. This break-in phenomenon is well known in CMP processes. With continued polishing, complete saturation of the polishing pad, and a concomitant leveling-off of the polish rate is experienced. It may therefore be desirable to intentionally pre-condition the polishing pad with or without a "dummy" wafer prior to polishing.

Although the invention has been described herein with reference to various illustrative features, modifications and illustrative embodiments, it will be appreciated that the utility of the invention is not limited thereto, and that other variations, modifications and other embodiments of the invention are contemplated. Accordingly, the invention as hereafter claimed is intended to be broadly interpreted and construed, as including within the scope thereof all such variations, modifications and other embodiments.

What is claimed is:

1. A halide-based aqueous polishing slurry composition, for use in a chemical mechanical polishing process to remove noble metal and/or noble metal alloy from a substrate having said noble metal and/or noble metal alloy deposited on the substrate, comprising:
   (1) abrasive polishing particles; and
   (2) a halide-based oxidizer chemistry consisting essentially of:
      (a) a bromide compound selected from group consisting of ammonium bromide, potassium bromide, sodium bromide, and hydrogen bromide, wherein the bromide compound is present in the halide-based oxidizer chemistry in a concentration of at least about 12 percent by weight thereof;
      (b) a bromate compound, which provides free bromine as an oxidizing agent in the composition, the bromate compound in an amount less than the bromide compound; and
      (c) an organic acid, which mediates decomposition of the bromate compound in the composition;
      (d) optionally, an anionic surfactant, wherein the surfactant when present is at a concentration of up to 4 percent by weight in the halide-based oxidizer chemistry; and
   (e) deionized water;
      wherein the halide in said halide-based aqueous polishing slurry composition consists of said bromide compound and said bromate compound.

2. The composition of claim 1, wherein the abrasive polishing particles include particles of a material selected from the group consisting of alumina, ceria, silica, diamond and silicon carbide.

3. The composition of claim 1, wherein the abrasive polishing particles have a mean particle size below about 1 micron.

4. The composition of claim 1, wherein the abrasive polishing particles have a mean particle size below about 0.1 micron.

5. The composition of claim 1, wherein said organic acid is present in the composition at a concentration of from about 1% to about 4% by weight, based on the total weight of the composition, and wherein the aqueous polishing slurry composition has a pH in the range of from about 2 to about 4.

6. The composition of claim 1, wherein the bromide compound is present in a concentration of from about 12 to about 18 percent by weight, the bromate compound is present in a concentration of from about 4 to about 6 percent by weight, and the organic acid is present at a concentration of from about 1 to about 4 percent by weight, based on the total weight of the composition.

7. The composition of claim 1, further comprising deionized water as an aqueous medium thereof.

8. The composition of claim 1, wherein the bromate compound comprises a compound selected from the group consisting of potassium bromate, ammonium bromate, sodium bromate, and hydrogen bromate.

9. The composition of claim 1, wherein the organic acid comprises a compound selected from the group consisting of oxalic acid, formic acid, malonic acid, malic acid, gluconic acid, and lactic acid.

10. The composition of claim 1, wherein the bromide compound comprises ammonium bromide, the bromate compound comprises potassium bromate, and the organic acid comprises oxalic acid.

11. The composition of claim 1, wherein the halide-based oxidizer chemistry consists essentially of the following comprising by weight, based on the total weight (100%) of the composition:

| Compound | Amount (wt. %) |
| --- | --- |
| anionic surfactant | 0–4% |
| ammonium bromide | 12–18% |
| potassium bromate | 4–6% |
| citric acid | 1–4% |
| DI Water | -balance-. |

12. The composition of claim 1, wherein the bromide compound comprises ammonium bromide.

13. The composition of claim 1, wherein the abrasive polishing particles include particles of alumina.

14. The composition of claim 13, wherein the abrasive polishing particles of alumina have a mean particle size <0.1 microns.

15. The composition of claim 1, further comprising an anionic surfactant.

16. The composition of claim 15, wherein the anionic surfactant comprises a carboxylic acid.

* * * * *